United States Patent [19]

Kruse, Jr.

[11] Patent Number: 4,970,395
[45] Date of Patent: Nov. 13, 1990

[54] WAVELENGTH TUNABLE INFRARED DETECTOR BASED UPON SUPER-SCHOTTKY OR SUPERCONDUCTOR-INSULATOR-SUPERCONDUCTOR STRUCTURES EMPLOYING HIGH TRANSITION TEMPERATURE SUPERCONDUCTORS

[75] Inventor: Paul W. Kruse, Jr., Edina, Minn.

[73] Assignee: Honeywell Inc., Minneapolis, Minn.

[21] Appl. No.: 289,276

[22] Filed: Dec. 23, 1988

[51] Int. Cl.$^5$ ............................................. H01L 39/02
[52] U.S. Cl. .................................... 250/336.2; 357/5;
505/701; 505/848; 505/849
[58] Field of Search ..................... 250/336.2; 505/701,
505/848, 849; 357/5

[56] References Cited

U.S. PATENT DOCUMENTS 3,906,231  9/1975  Fletcher et al. ................. 250/336.2
3,995,278 11/1976  Young ............................. 505/848 X

FOREIGN PATENT DOCUMENTS 0014979  1/1989  Japan ...................................... 357/5

OTHER PUBLICATIONS

Morohashi et al., "Plasma Polymerization for High Tc Oxide Superconductors", Applied Physics Letters, vol. 52, No. 22 (May 30, 1988), pp. 1897–1898.
de Vries et al., "Preparation, Patterning and Properties of Thin YBa$_2$Cu$_3$O$_{7-8}$ Films", Applied Physics Letters, vol. 52, No. 22 (May 30, 1988), pp. 1904–1906.
Deutscher et al., "A Graular Photo–Superconductor", Applied Physics Letters, vol. 71A, Nos. 5, 6 (May 28, 1979), pp. 471–472.
Kawakami et al., "Proximity Effect in Bulk and Surface Inversion Layer of InAs and Its Application to Superconducting Transistors", Japanese Journal of Applied Physics, vol. 26, Supplement 26-3, 1987, pp. 2059–2064.
Thayer, "High Temperature Superconductors on the Road to Applications", Chemical & Engineering News, Nov. 27, 1989, pp. 9–24.
Tucker & Feldman, "Quantum Detection at Millimeter Wavelengths", Review Modern Physics, vol. 57, No. 4, Oct. 1985, pp. 1055–1113.
Dayem & Martin, "Quantum Interaction of Microwave Radiation with Tunneling Between Superconductors", Phys. Rev. Letters, vol. 8, No. 6, Mar. 15, 1962, pp. 246–248.
McColl et al., "The Superconductor–Semiconductor Schottky Barrier Diode Detector", Appl. Phys. Lett., vol. 23, No. 5, Sep. 1, 1973, pp. 263–264.

Primary Examiner—Constantine Hannaher
Assistant Examiner—J. Eisenberg
Attorney, Agent, or Firm—Gregory A. Bruns

[57] ABSTRACT

A photon detector based upon photon-assisted tunneling in superconductor-insulator-superconductor or super-Schottky structures, in which the superconductor is a high transition temperature superconductor. An electrical bias is provided on either side of such structures so that photo-assisted tunneling, in the presence of incident photons on the structure, can occur to thereby permit a tunneling current therebetween.

18 Claims, 2 Drawing Sheets

WAVELENGTH TUNABLE INFRARED DETECTOR BASED UPON SUPER-SCHOTTKY OR SUPERCONDUCTOR-INSULATOR-SUPERCONDUCTOR STRUCTURES EMPLOYING HIGH TRANSITION TEMPERATURE SUPERCONDUCTORS

BACKGROUND AND SUMMARY OF THE INVENTION

The invention is directed to exploiting photon-assisted tunneling in high transition temperature superconductor structures for use as an infrared photon detector. One application is an infrared photon detector optimized for the detection of cold bodies in space, i.e., whose operating spectral response is in the wavelengths of about 10 $\mu$m to about 100 $\mu$m at a temperature of 77° K. or higher.

The detection of cold bodies in space is a most difficult technical problem. The wavelengths of interest lie generally in the 10 $\mu$m to 100 $\mu$m spectral interval. A widely used prior art detector $Hg_{1-x}Cd_xTe$ (i.e., $Hg_{.795}Cd_{.205}Te$) operating at 77° K., is limited to wavelengths less than 12 $\mu$m as has been shown by Kruse, "The Emergence of Mercury Cadmium Telluride as a Modern Infrared Sensitive Material:" Chapter 1 of *Semiconductors and Semimetals* 18, *Mercury Cadmium Telluride*, R. K. Willardson and A. C. Beer, eds. Academic Press, New York (1981). To achieve longer wavelength operation requires a smaller value of "x" in the $Hg_{1-x}Cd_xTe$, such as $Hg_{.82}Cd_{.18}Te$. A strong disadvantage however, is that the lower value of "x" requires cooling to temperatures below 77° K. Another limitation of small bandgap $Hg_{1-x}Cd_xTe$, i.e. (Hg,Cd)Te, is the difficulty in achieving satisfactorily high $R_oA$ products needed for photovoltaic operation.

Another prior art detector is extrinsic silicon. This includes silicon with shallow dopants which give rise to spectral responses extending beyond 12 $\mu$m, for example, Si:Ga detects radiation out to about 18 $\mu$m, Si:As to about 24 $\mu$m, and Si:Sb to about 30 $\mu$m. Extrinsic Si detectors operating at these longer wavelengths require cooling well below 77° K. Operating temperatures of these photoconductive detectors are below 20° K. requiring liquid He as the cryogenic medium.

In the present invention there is disclosed a photon detector that can have a spectral response extending at least to about 100 $\mu$m operates at liquid nitrogen temperatures (77° K.) or higher. The present invention utilizes the photoeffects in high transition temperature superconductors such as $YBa_2Cu_3O_7$ and utilizing as the principle of operation photon-assisted tunneling.

DESCRIPTION

Figure 1:
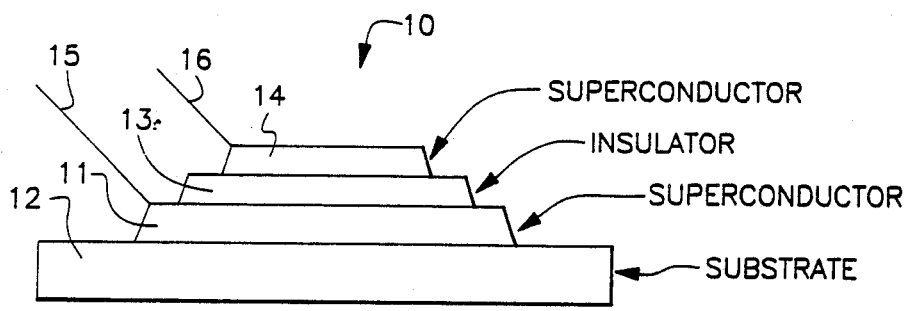
FIG. 1 is a pictorial representation of a superconductor-insulator-superconductor tunneling infrared detector.

In this description there is described two embodiments of an IR photon detector in a high transition temperature superconductor whose transition temperature lies at or above 77° K. Such a superconductor is $YBa_2Cu_3O_7$ whose transition temperature is in the range of 89°–94° K. One of these embodiments is a superconductor-insulator-superconductor structure and the other a super-Schottky structure. Referring now to FIG. 1 there is shown a sketch of a superconductor-insulator-superconductor (S-I-S) tunneling infrared detector 10. The S-I-S device is fabricated by depositing a layer 11 of a high transition temperature superconductor such as $YBa_2Cu_3O_7$ on an insulating substrate 12, e.g. by sputtering such a material. Layer 11 may be thin-film or a much thicker structure without any significant difference in electrical behavior. The fabrication of layer 11 on a substrate 12 is not a part of the invention as layer 11 may instead be a self supporting member if desired. Over the layer 11 is deposited a thin film insulator 13 (a tunneling barrier) such as about 50 angstroms of $SiO_2$. Over that tunneling barrier insulator film 13 is deposited a second thin film layer 14 of a high transition temperature superconductor. Ohmic contacts 15 and 16 are made to both superconducting layers 11 and 14, respectively. The structure 10 can be mounted on the cold finger of a Dewar. A cold shield limits the field of view of the detector through a long wavelength infrared transmitting window such as $C_sI$.

Figure 2:
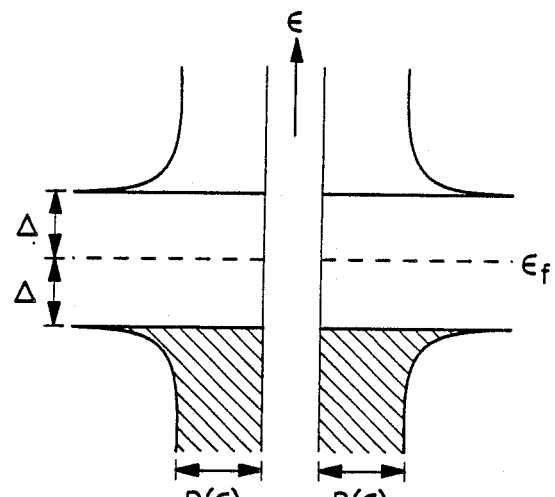
FIG. 2 is a diagram of densities of states $D(\epsilon)_s$ for S-I-S tunnel junctions (with the same superconductor on each side) in the neighborhood of the Fermi energy $\epsilon_F$. The energy $2\Delta$ required to break a pair of electrons is shown as a gap in the densities of quasi-particle states for the superconductors. States which are filled at T=0 are shaded.

When two superconductors 11 and 14 are separated by a thin insulator 13, the composite structure 10 is known as a S-I-S structure. Below the superconducting transition temperature the free electrons in the superconductor are bound in pairs known as Cooper pairs. In FIG. 2 there is shown a density of states diagram of an S-I-S structure giving the superconductor density of states, $D_s$, as a function of energy. Here the forbidden energy gap, whose value in electron volts is given by $2\Delta/e$, where e is the free electron charge, and $\Delta$ is the superconductor energy gap parameter represents the energy to break a Cooper pair.

Figure 3:
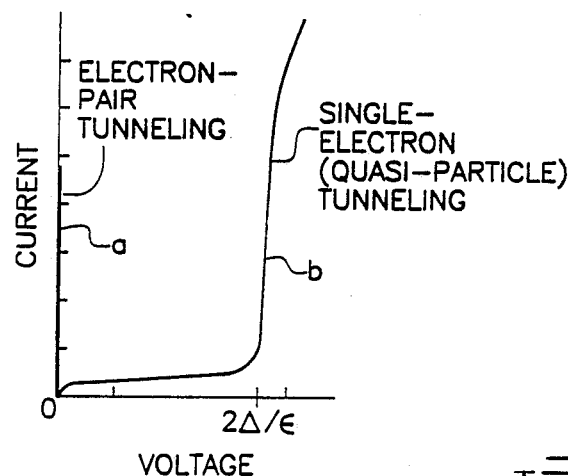
FIG. 3 is a diagram of DC Current-Voltage characteristics of S-I-S structures.

The dc current-voltage characteristic of an S-I-S structure is illustrated in FIG. 3 giving the current through the structure, plotted on the ordinate axis, as a function of the voltage thereacross plotted on the abscissa. There are two branches to the current. At zero bias a current (curve a) flows due to Cooper pair tunneling through the oxide separating the superconductors. This is known as the Josephson, or electron pair, current. When a bias is applied across the junction the other branch of the current (curve b) appears, known as quasi-particle or single electron tunneling. This represents the condition under which a single electron from a filled state on one side of the junction can tunnel into an empty state on the other side. The applied voltage at which this occurs is therefore $2\Delta/e$. At voltages exceeding this value, the current rises with a slope given by the normal resistance of the junction.

Radiation incident upon an S-I-S structure affects both branches of the current-voltage characteristic. This discussion however concerns only the photon-assisted quasi-particle tunneling current.

Figure 4:
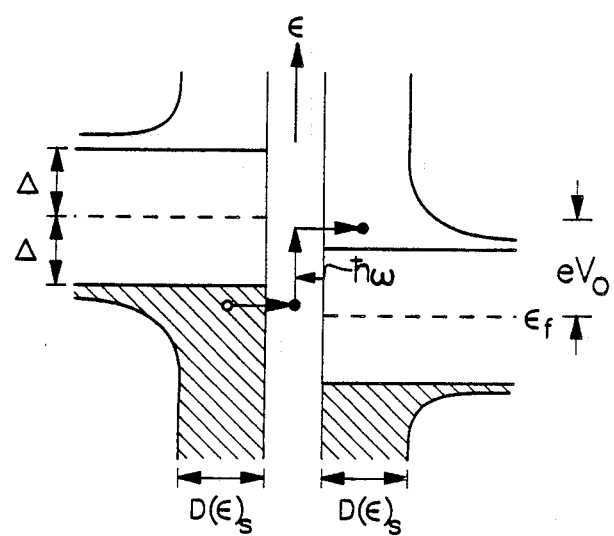
FIG. 4 illustrates the effect of electrical bias upon the density of states diagram for S-I-S structures. An absorbed photon of energy $\hbar\omega$ breaks a Cooper pair within one superconductor region resulting in an electron tunneling through the insulating barrier into the other superconductor.

The density of states diagram of FIG. 2 is redrawn in FIG. 4 with a bias voltage applied to the structure of FIG. 1 for illustrating photon-assisted quasi-particle tunneling. Under the action of an electrical bias, the Fermi levels are offset as shown. Thus a photon of energy $\hbar\omega$ (where $\hbar$ is Planck's constant divided by $2\pi$ and $\omega$ is the angular frequency of the radiation) can excite single-particle tunneling from a filled state on one side of the junction to an empty state on the other side. Similarly, at lower bias, two photons, each of energy $\hbar\omega$, can supply the requisite energy. At even lower biases, three, four, or more photons can supply the energy. Thus the current-voltage characteristic for photon-assisted quasi-particle tunneling is a series of steps. In this invention therefore the principle of operation is based upon photon-assisted tunneling in an S-I-S structure. Infrared photons incident upon the structure assist electrons to tunnel from the filled states on one side of the S-I-S structure to the empty states on the other side as shown in FIG. 4. A positive electrical bias $V_o$ on one side with respect to the other provides additional energy $eV_o$ such that the sum of the photon energy $\omega$ and electrical energy $eV$ equals or exceeds the forbidden gap energy $2\Delta$ of the superconductor. Because the forbidden gap energies of high transition temperature superconductor, such as $YBa_2Cu_3O_7$, are far larger than those of conventional superconductors, the spectral response of this S-I-S structure lies in the infrared rather than in the microwave or millimeter-wave region. Wavelength tunability is achieved by varying the electrical bias; increasing $eV_o$ reduces $\hbar\omega$ in order that the sum equals or exceeds the gap energy $2\Delta$. Thus in FIG. 1 when a bias is applied to contacts 15 and 16, and photons impinge on the detector superconductor layer 14, tunneling electrons occur through the insulator layer 13 to the superconductor region 11 which receives the tunneling electrons.

Figure 5:
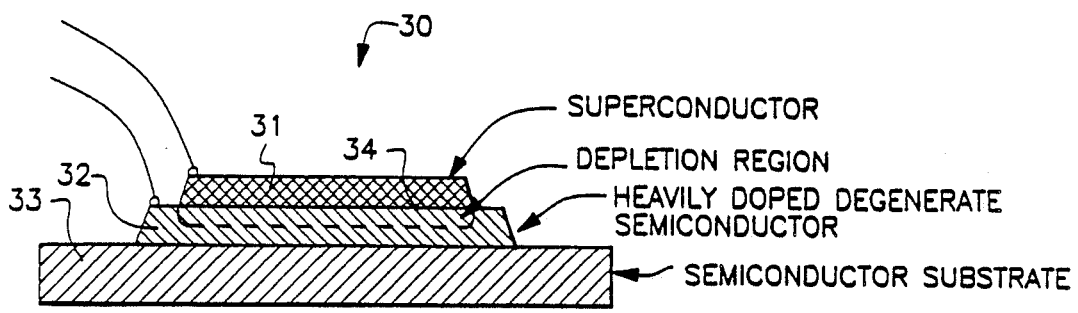
FIG. 5 is a super-Schottky embodiment of the tunneling IR detector.

Another embodiment of the invention is shown in FIG. 5. Briefly, this embodiment employs a super-Schottky structure using a high temperature superconductor such as $YBa_2Cu_3O_7$ and a heavily doped degenerate semiconductor such as GaAs or Si. The principle of operation is based on photon-assisted tunneling. Infrared photons incident on the structure assist electrons to tunnel from the filled states of the superconductor to the empty states of the semiconductor.

Figure 6:
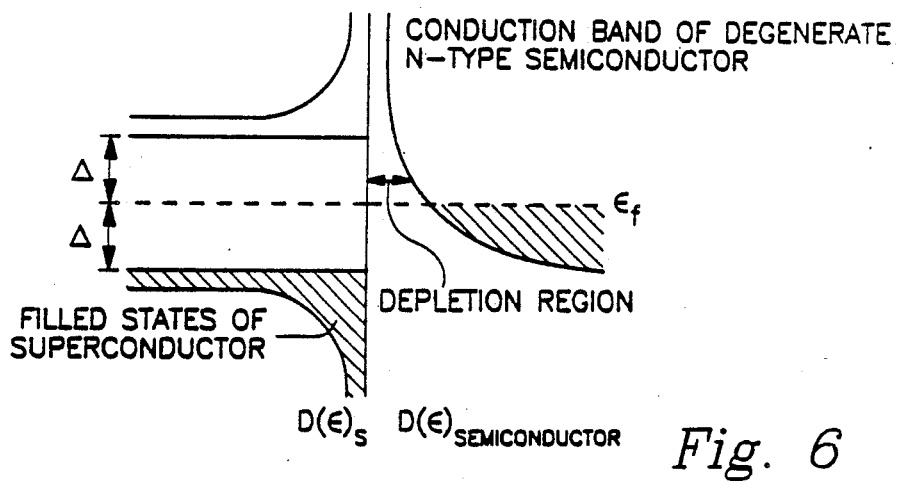
FIG. 6 is a diagram of densities of states for super Schottky tunnel junctions in the neighborhood of the Fermi level $\epsilon_F$ with the density of states for the superconductor designated $D(\epsilon)_s$ and for the semiconductor designated $D(\epsilon)_{semiconductor}$. The energy $2\Delta$ required to break a pair of electrons is shown as a gap in the densities of quasi particle states for the semiconductor. The semiconductor is degenerate N-type with the Fermi level in the conduction band. States which are filled at T=0 are shaded.
Figure 7:
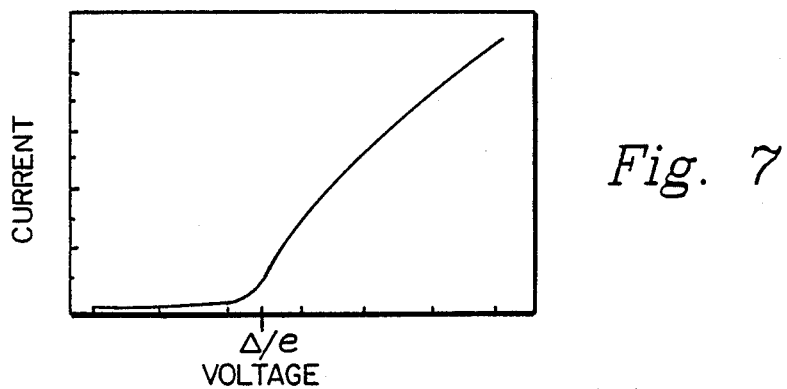
FIG. 7 is a diagram of DC current-voltage characteristics of super-Schottky structures.
Figure 8:
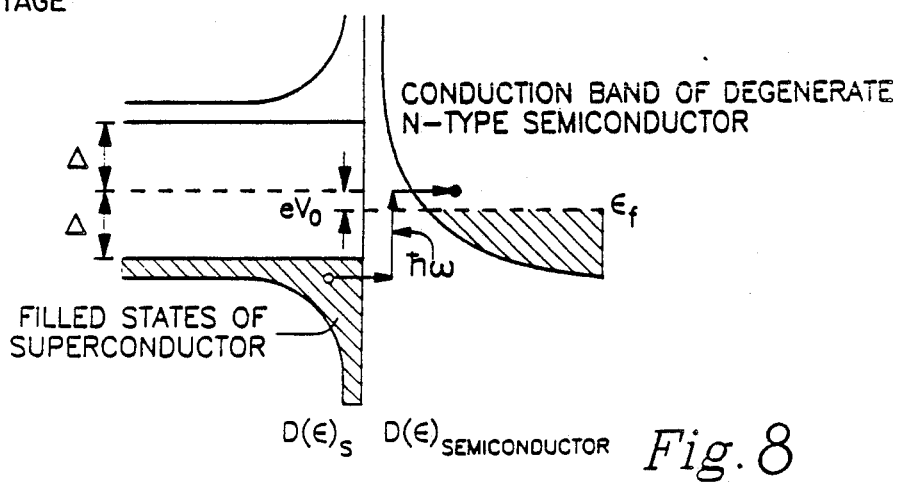
FIG. 8 illustrates the effect of electrical bias upon the density of states diagram for a super Schottky structure. An absorbed photon of energy $\hbar\omega$ breaks a Cooper pair within the superconductor resulting in an electron tunneling through the depletion region of the semiconductor.

The super-Schottky diode 30 of Figures consists of a thin film high transition temperature superconductor 31 in intimate contact with the surface of a heavily doped, degenerate semiconductor 32 (e.g. GaAs or Si) which is on a semiconductor substrate 33. In another embodiment the heavily doped semiconductor forms its own substrate. Rather than an oxide layer forming the tunneling barrier, as in the S-I-S embodiment described above, the tunneling barrier is the depletion region 34 within the heavily doped semiconductor adjacent the interface, the remaining portion of the layer 32 being the region which receives the tunneling electrons. FIG. 6 shows the density of states diagram of an unbiased super-Schottky structure giving the superconductor and semiconductor density of states, $D_s$ and $D_{semiconductor}$, respectively, as a function of energy $\epsilon$, and FIG. 8 shows the density of states diagram of an electrically biased super-Schottky structure showing the photon-assisted tunneling between the filled states in the superconductor 31 and the empty states in the semiconductor 32. The semiconductor 32 is heavily doped to reduce the depletion width 34, thereby increasing the tunneling probability. When sufficient bias is applied, electrons tunnel from the superconductor 31, to the semiconductor 32. From FIG. 6 it can be seen that at absolute zero, in the absence of incident photons, no current can flow until the applied bias V reaches $\Delta/e$, corresponding to half the energy gap of the superconductor since there will be no electrons thermally excited across the energy gap to the empty states of the superconductor to then pass directly through the semiconductor depletion region to the empty states of the semiconductor bulk. After the applied bias voltage reaches $\Delta/e$, current flow rapidly increases because direct tunneling becomes possible. At temperatures above $T=0$ but below the transition temperature of the superconductor, a small current will flow even for V less that $\Delta/e$ due to some such thermally excited electrons crossing the energy gap to the empty superconductor states. This current is proportional to $\exp(eV/kT)$, where k is Boltzmann's constant. Thus the corresponding current-voltage characteristic shown in FIG. 7, giving the current through the structure of FIG. 5, plotted on the ordinate axis, as a function of the voltage thereacross, plotted on the abscissa, and is seen to be highly nonlinear.

When the semiconductor is biased with respect to the superconductor, absorbed photons allow electrons to tunnel from the filled states of the superconductor through the depletion region into empty states within the semiconductor. Since availability of empty states within the semiconductor is a function of kT, it is clear that photon-assisted tunneling is a function of $\hbar\omega/kT$. The implication of this to high transition temperature superconductors is that the minimum energy for photon detection increases as the operating temperature is raised. In other words, the long wavelength limit of a super-Schottky photon detector decreases as the temperature of operation increases. Restated, an electrical bias on the semiconductor with respect to the superconductor (e.g., positive bias on an n-type semiconductor) provides additional energy such that the sum of the photon energy $\hbar\omega$ and the electrical energy $eV_o$ equals or exceeds half the forbidden energy gap (half of $2\Delta$) of the superconductor. Because the forbidden gap energies of the high transition temperature superconductors are far larger than those of conventional superconductors, the spectral response of this super-Schottky structure lies in the infrared rather than the microwave or millimeter wave region. Wavelength tunability is achieved by varying the electrical bias; increasing $eV_o$ reduces $\hbar\omega$ in order that the sum equals $\Delta$.

The embodiments of an invention in which an exclusive property or right is claimed are defined as follows:

1. A photon detector based on superconductor-insulator-superconductor or super-Schottky structures employing high transition temperature superconductors with a mode of operation depending upon photon-assisted tunneling therein, the detector comprising:

an outer thin film layer of a high transition temperature superconductor material exposed sufficiently to permit receiving incident photons;

an inner layer means on which said outer thin film layer is deposited, said inner layer means providing a barrier to substantial conductive current and to a tunneling current through the inner layer means region adjacent the interface with said outer thin film layer absent external assistance for establishing such a tunneling current;

a first ohmic contact made to said outer thin film layer; and a second ohmic contact made to said inner layer means with said first and second ohmic contacts being adapted to receive an electrical bias so that photon-assisted tunneling from said outer thin film layer, if receiving incident photons, to said inner layer means can occur to thereby permit said tunneling current therebetween.

2. The photon detector according to claim 1 in which said high transition temperature superconductor material has a transition temperature above 77 degrees K.

3. The photon detector according to claim 2 in which said high transition temperature superconductor material is $YBa_2Cu_3O_7$.

4. The photon detector according to claim 1 in which said inner layer means comprises a thin film electrical insulator layer deposited on an inner thin film superconductor layer.

5. The photon detector according to claim 1 in which said inner layer means comprises a heavily doped degenerate semiconductor whereby a Schottky junction is formed with said outer thin film layer.

6. The photon detector according to claim 1 which is a cold body IR detector for the 10 to 100 $\mu$m spectral interval.

7. An IR detector based on Super-Schottky structures employing high transition temperature superconductors with a mode of operation depending on photon-assisted tunneling therein, the detector comprising:

a thin film layer of a high transition temperature superconductor material exposed sufficiently to permit receiving incident photons, the thin film layer being deposited in intimate contact on a heavily doped degenerate semiconductor whereby a Schottky junction is formed at the interface;

a first ohmic contact made to said thin film layer; and a second ohmic contact made to said heavily doped semiconductor such that a depletion region can form in said heavily doped degenerate semiconductor adjacent the interface with said thin film layer if an electrical bias is applied to said contacts, said depletion region forming a barrier to substantial conductive current and to a tunneling current therethrough absent external assistance for establishing such a tunneling current, with said first and second ohmic contacts being adapted to receive an electrical bias so that photon-assisted tunneling from the thin film layer, if receiving incident photons, to the heavily doped degenerate semiconductor can occur to thereby permit said tunneling current therebetween.

8. The IR detector according to claim 7 in which said high transition temperature superconductor material has a transition temperature above 77 degrees K.

9. The IR detector according to claim 8 in which said high transition temperature superconductor material is $YBa_2CU_3O_7$.

10. The IR detector according to claim 7 which is a cold body IR detector for the 10 to 100 $\mu$m spectral interval.

11. An IR detector based on superconductor-insulator-superconductor structures employing high transition temperature superconductors with a mode of operation depending on photon-assisted tunneling therein, the detector comprising:

a first layer of a high transition temperature superconductor material;

a thin film insulator layer deposited on said first layer;

a second thin film layer of high transition temperature superconductor material deposited on said thin film insulator layer and exposed sufficiently to permit receiving incident photons;

a first ohmic contact made to said first layer; and a second ohmic contact made to said second thin film layer with said first and second ohmic contacts being adapted to receive an electrical bias so that photon-assisted tunneling from the second thin film layer, if receiving incident photons, through the thin film insulator layer to the first layer can occur to thereby permit a tunneling current therebetween.

12. The IR detector according to claim 11 in which said high transition temperature superconductor material has a transition temperature above 77 degrees K.

13. THe IR detector according to claim 12 in which said high transition temperature superconductor material is $YBa_2Cu_3O_7$.

14. The IR detector according to claim 11 which is a cold body IR detector for the 10 to 100 $\mu$m spectral interval.

15. A photon-assisted tunneling IR detector and circuit based on superconductor-insulator-superconductor structures employing high transition temperature superconductors, the detector and circuit comprising:

a substrate having deposited thereon a first thin film superconductor layer of a high transition temperature (e.g. >77° K.) superconductor material, said material having a forbidden gap energy of $2\Delta$;

a thin-film insulator layer deposited on said first thin film superconductor layer;

a second thin film superconductor layer of high transition temperature superconductor material deposited on said thin film insulator layer and upon which incident IR photons of energy $\omega$ can impinge;

first and second ohmic contacts made to said first and second thin film superconductor layers, respectively, to complete said detector; and an electrical bias circuit with means connecting said electrical bias circuit to said first and second ohmic contacts to apply a positive electrical bias on one of said first and second ohmic contacts with respect to the other to provide additional energy such that the sum of the photon energy $\hbar\omega$ and electrical energy $eV_o$ equals the forbidden energy gap $2\Delta$ of the high transition temperature superconductor material, so that photon-assisted tunneling from one of said first and second thin film superconductor layers to the other can occur.

16. A photon-assisted tunneling IR detector and circuit based on Super-Schottky structures employing high transition temperature superconductors, the detector and circuit comprising:

a semiconductor substrate having deposited thereon a thin film layer of a heavily doped semiconductor;

at thin film layer of a high transition temperature (e.g. >77° K.) superconductor material deposited on said thin film heavily doped semiconductor layer surface to form a Schottky barrier at the surface and upon which incident IR photons of energy $\omega$ can impinge;

an ohmic contact to said thin film high transition temperature superconductor material layer and another ohmic contact to said thin film heavily doped semiconductor layer to complete said detector; and and an electrical bias circuit with means connecting said electrical bias circuit to said ohmic contacts to apply a positive electrical bias on one ohmic contact with respect to the other to provide additional energy such that the sum of the photon energy $\omega$ and the electrical energy $eV_o$ equals half the forbidden energy gap $2\Delta$ of the high transition temperature superconductor material, so that photon-assisted tunneling from said thin film high transition temperature superconductor material layer to the adjacent thin film heavily doped semiconductor layer can occur.

17. A cold body IR detector for the 10 to 100 $\mu$m spectral interval based on superconductor-insulator-superconductor or super-Schottky structures employing high transition temperature superconductor with a mode of operation depending upon photon-assisted tunneling therein, the detector comprising:

an outer thin film layer of a high transition temperature superconductor material exposed sufficiently to permit receiving incident photons, said superconductor material having a transition temperature above 77°;

an inner layer means on which said outer thin film layer is deposited, said inner layer means providing a barrier to substantial conductive current and to a tunneling current through the inner layer means region adjacent the interface with said outer thin film layer absent external assistance for establishing such a tunneling current;

a first ohmic contact made to said outer thin film layer; and a second ohmic contact made to said inner layer means with said first and second ohmic contacts being adapted to receive an electrical bias so that photon-assisted tunneling from outer thin film layer, if receiving incident photons, to said inner layer can occur to thereby permit said tunneling current therebetween.

18. A cold body IR detector for the 10 to 100 $\mu$m spectral interval based on Super-Schottky structures employing high transition temperature superconductors with a mode of operation depending on photon-assisted tunneling therein, the detector comprising:

a thin film layer of a high transition temperature superconductor material exposed sufficiently to permit receiving incident photons, said high transition temperature superconductor material having a transition temperature above 77° K., said thin film high transition temperature superconductor material layer being deposited in intimate contact on a heavily doped degenerate semiconductor thin film layer whereby a Schottky junction is formed, and said heavily doped degenerate semiconductor thin film layer being deposited on the surface of a substrate;

a first ohmic contact made to said thin film high transition temperature superconductor material layer; and a second ohmic contact made to said heavily doped degenerate semiconductor thin film layer such that a depletion layer can be formed in said heavily doped degenerate semiconductor thin film layer adjacent the interface with said thin film high transition temperature superconductor material layer if an electrical bias is applied to said first and second ohmic contacts, said depletion layer forming a barrier to substantial conductive current and to a tunneling current therethrough absent external assistance for establishing such a tunneling current with said first and second ohmic contacts being adapted to receive an electrical bias so that photon-assisted tunneling from the thin film high transition temperature superconductor material layer, if receiving incident photons, to the heavily doped degenerate semiconductor thin film layer can occur to thereby permit said tunneling current therebetween.

* * * * *

UNITED STATES PATENT AND TRADEMARK OFFICE
CERTIFICATE OF CORRECTION

PATENT NO. : 4,970,395

DATED : November 13, 1990

INVENTOR(S) : Paul W. Kruse, Jr.

It is certified that error appears in the above-identified patent and that said Letters Patent is hereby corrected as shown below:

In claim 15:

Column 6, line 56, cancel " $\omega$ " and substitute -- $\hbar\omega$ --.

Column 6, line 66, cancel " $\omega$ " and substitute -- $\hbar\omega$ --.

In claim 16:

Column 7, line 10, cancel "at" and substitute --a--.

Column 7, line 16, cancel " $\omega$ " and substitute -- $\hbar\omega$ --.

Column 7, line 27, cancel " $\omega$ " and substitute -- $\hbar\omega$ --.

Signed and Sealed this

Seventeenth Day of March, 1992

Attest:

HARRY F. MANBECK, JR.

*Attesting Officer*  *Commissioner of Patents and Trademarks*